United States Patent
Shiraishi

(10) Patent No.: US 8,431,328 B2
(45) Date of Patent: Apr. 30, 2013

(54) EXPOSURE METHOD, METHOD FOR MANUFACTURING FLAT PANEL DISPLAY SUBSTRATE, AND EXPOSURE APPARATUS

(75) Inventor: Naomasa Shiraishi, Saitama (JP)

(73) Assignee: Nikon Corporation, Tokyo (JP)

( * ) Notice: Subject to any disclaimer, the term of this patent is extended or adjusted under 35 U.S.C. 154(b) by 207 days.

(21) Appl. No.: 12/010,153

(22) Filed: Jan. 22, 2008

(65) Prior Publication Data

US 2008/0206685 A1  Aug. 28, 2008

Related U.S. Application Data

(60) Provisional application No. 60/902,496, filed on Feb. 22, 2007.

(51) Int. Cl.
*G03F 7/20* (2006.01)

(52) U.S. Cl.
USPC .......................................... 430/311; 430/394

(58) Field of Classification Search .................. 430/311, 430/396, 397, 319, 320, 321
See application file for complete search history.

(56) References Cited

U.S. PATENT DOCUMENTS

| | | |
|---|---|---|
| 6,233,044 B1 | 5/2001 | Brueck et al. |
| 2002/0187440 A1 | 12/2002 | Kochi et al. |
| 2002/0187636 A1 | 12/2002 | Pierrat et al. |
| 2004/0008332 A1 | 1/2004 | Nakaya et al. |
| 2004/0023128 A1 | 2/2004 | Yamamoto et al. |
| 2004/0110092 A1 | 6/2004 | Lin |
| 2004/0150804 A1 | 8/2004 | Iizuka et al. |
| 2004/0209193 A1 | 10/2004 | Pierrat et al. |
| 2005/0074698 A1 | 4/2005 | Borodovsky |
| 2005/0142501 A1 | 6/2005 | Kim |
| 2005/0147921 A1 | 7/2005 | Lin et al. |
| 2006/0046156 A1 | 3/2006 | Amako et al. |
| 2006/0110694 A1 | 5/2006 | Lin |
| 2006/0119819 A1 | 6/2006 | Iizuka et al. |
| 2006/0132735 A1 | 6/2006 | Lof et al. |
| 2006/0210930 A1 | 9/2006 | Yamamoto et al. |
| 2008/0187869 A1 | 8/2008 | Pierrat et al. |

FOREIGN PATENT DOCUMENTS

| | | |
|---|---|---|
| EP | 0 939 343 A1 | 9/1999 |
| EP | 1443361 A2 | 8/2004 |
| EP | 1443361 A3 | 11/2005 |
| EP | 1 630 612 A2 | 3/2006 |
| EP | 1 881 372 A2 | 12/2006 |
| EP | 1840944 A1 | 10/2007 |
| EP | 1 852 894 A1 | 11/2007 |

(Continued)

OTHER PUBLICATIONS

Japanese Abstract No. 2000-21748 published Jan. 21, 2000, pp. 1-26.

(Continued)

*Primary Examiner* — Kathleen Duda
*Assistant Examiner* — Caleen Sullivan
(74) *Attorney, Agent, or Firm* — Finnegan, Henderson, Farabow, Garrett & Dunner, L.L.P.

(57) ABSTRACT

An exposure method and exposure apparatus optimal for the formation of a fine pattern of an electronic device, such as a flat panel display. The exposure method and apparatus provides a high resolution and is inexpensive. The exposure method exposes a pattern onto a substrate with the use of an optical system that performs interference exposure for exposing a pattern parallel to a predetermined scanning direction with an interference optical system and variable shaping exposure with a variable shaping optical system while performing relative scanning in the scanning direction.

20 Claims, 11 Drawing Sheets

FOREIGN PATENT DOCUMENTS

| | | |
|---|---|---|
| JP | 07-226362 | 8/1995 |
| JP | 7-226362 | 8/1995 |
| JP | 2000-021761 | 1/2000 |
| JP | 2002-253955 | 9/2002 |
| JP | 2005-300809 | 10/2005 |
| JP | 2006-017895 | 1/2006 |
| WO | WO 2005/075720 A1 | 1/2006 |
| WO | WO 2006/064363 A1 | 6/2006 |
| WO | WO 2006/088643 A2 | 8/2006 |
| WO | WO 2006/090807 A1 | 8/2006 |

OTHER PUBLICATIONS

Preliminary Notice of First Office Action issued on Aug. 16, 2012 by the Taiwanese Patent Office in Taiwan Patent Application No. 097102639; including translation (15 pages total).

Notification of Reasons for Rejection issued on Aug. 28, 2012 by the Japanese Patent Office in Japanese Patent Application No. 2008-040131 on Aug. 28, 2012, including translation (9 pages total).

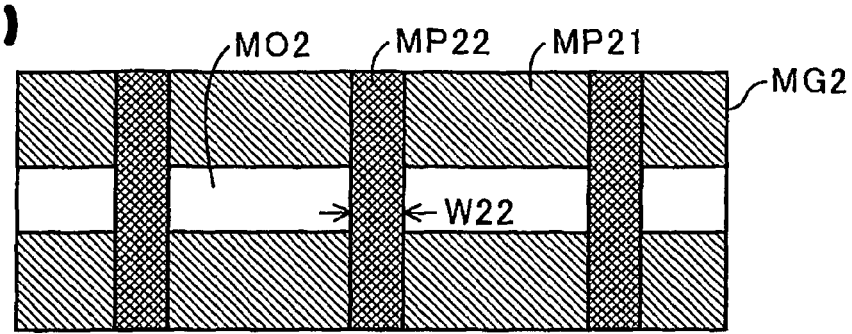
Fig.5(A)
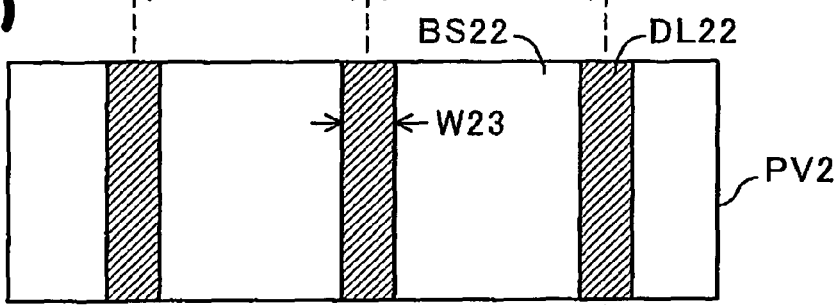
Fig.5(B)
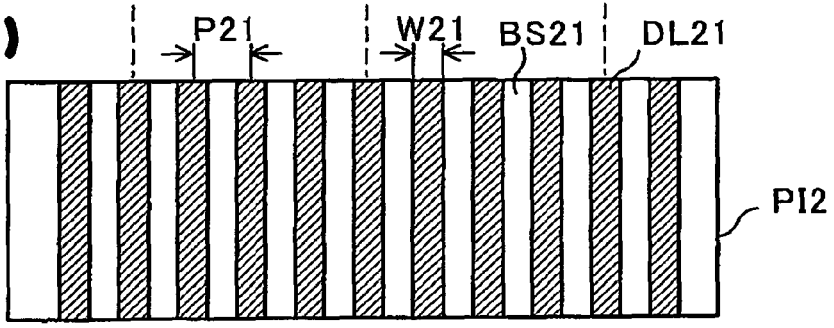
Fig.5(C)
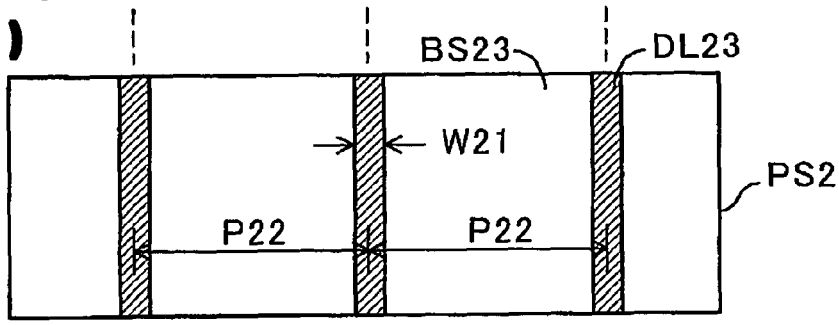
Fig.5(D)
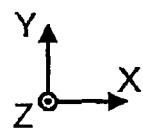

EXPOSURE METHOD, METHOD FOR MANUFACTURING FLAT PANEL DISPLAY SUBSTRATE, AND EXPOSURE APPARATUS

This application claims the benefit of U.S. provisional No. 60/902,496, filed Feb. 22, 2007, the contents of which are incorporated herein by reference.

BACKGROUND OF THE INVENTION

The present invention relates to an exposure method used during a fine pattern formation step in a manufacturing process of a substrate that forms a picture display unit of a flat panel display. The present invention further relates to an optical exposure method and exposure apparatus that uses the manufacturing method.

During a process for manufacturing a substrate used as a flat panel display, such as a liquid crystal display or a plasma display, when forming a fine pattern on the substrate, photolithography is normally implemented. Photolithography forms a preferable pattern shape on the substrate by forming a photosensitive film (photoresist) on the surface of the substrate and performing an exposure step for exposing the substrate with exposure light having a light distribution that is in accordance with the shape of a pattern that is to be formed. Then, a development step, an etching step, and the like are performed.

In the prior art, in the above exposure step performed during the manufacturing process of a flat panel display substrate, a mask is mainly used in the exposure method.

The pattern that is to be formed on the substrate is formed on the mask. Then, the mask is illuminated with illumination light. The light distribution transmitted through the mask is exposed on the substrate to transfer the mask.

As an exposure apparatus used to perform the exposure, a proximity exposure apparatus, which exposes the silhouette of a mask pattern onto a substrate by arranging the mask in the proximity of the substrate, and a projection exposure apparatus, which arranges an imaging optical system between the mask and the substrate and exposes the image of a mask pattern onto a substrate, are mainly used.

SUMMARY OF THE INVENTION

The enlargement of flat panel displays have resulted in the necessity to enlarge substrates, on which the picture display units of the flat panel display is made, and to enlarge masks, which are used to manufacture the substrates.

However, the enlargement of masks results in an increase in the size and cost of the masks. Further, the size and cost of transportation, storage, and washing apparatuses for the mask, and the like are increased. This increases the manufacturing cost of the flat panel displays.

Accordingly, it is a first object of the present invention to provide an exposure method for forming a fine pattern on a substrate for a picture display unit of a flat panel display to be performed in an inexpensive manner.

It is another object of the present invention to provide a method for manufacturing a substrate for a flat panel display that uses the above exposure method and to provide an optimal exposure method and exposure apparatus used in the above manufacturing method.

A first aspect of the present invention is an exposure method for exposing a pattern onto a substrate with the use of an optical system. The exposure method includes preparing an interference optical system and a variable shaping optical system as the optical system, performing relative scanning of the substrate with the interference optical system and the variable optical system in a predetermined scanning direction, and during the relative scanning, performing interference exposure for exposing a pattern that is parallel to the scanning direction onto the substrate with the interference optical system and performing variable shaping exposure with the variable shaping optical system.

A second aspect of the present invention is a method for manufacturing a flat panel display substrate. The method includes an exposure step including at least one step of exposing a pattern onto a substrate with the exposure method of the first aspect of the invention.

A third aspect of the present invention is a method for manufacturing a flat panel display substrate. The method includes forming a pattern for forming a source electrode and drain electrode of a thin film transistor with the exposure method according to the second aspect, and forming the source electrode and drain electrode of the thin film transistor with the use of the formed pattern.

A fourth aspect of the present invention is an exposure apparatus for exposing a pattern onto a substrate. The exposure apparatus includes an interference optical system and a variable shaping optical system arranged so as to enable simultaneous exposure of the substrate. A movable mechanism enables scanning of the substrate relative to the interference optical system and the variable shaping optical system along a predetermined scanning direction in a plane of the substrate.

BRIEF DESCRIPTION OF THE DRAWINGS

FIG. 2 is a diagram showing the layout and the like of optical systems in the example according to the present invention, in which

FIG. 3 is a diagram showing an example of the interference optical system IO1, in which

FIG. 4 is a diagram showing an example of the variable shaping optical system VO1, in which

FIG. 5 is a diagram showing a first example of an exposure method according to the present invention;

DETAILED DESCRIPTION OF THE PREFERRED EMBODIMENTS

One embodiment of the present invention will now be discussed.

Hereinafter, a pattern represents the shape of a bright-dark distribution formed by exposure light.

Further, a mask pattern represents the distribution shape of one or both of a light transmission portion and light shielding portion formed on a mask.

An exposure pattern represents the exposure distribution shape exposed onto a photosensitive material, such as photoresist, that is formed on a substrate.

A substrate pattern represents at least part of a conductive member, an insulative member, or a semiconductor member formed on a substrate.

Figure 1:
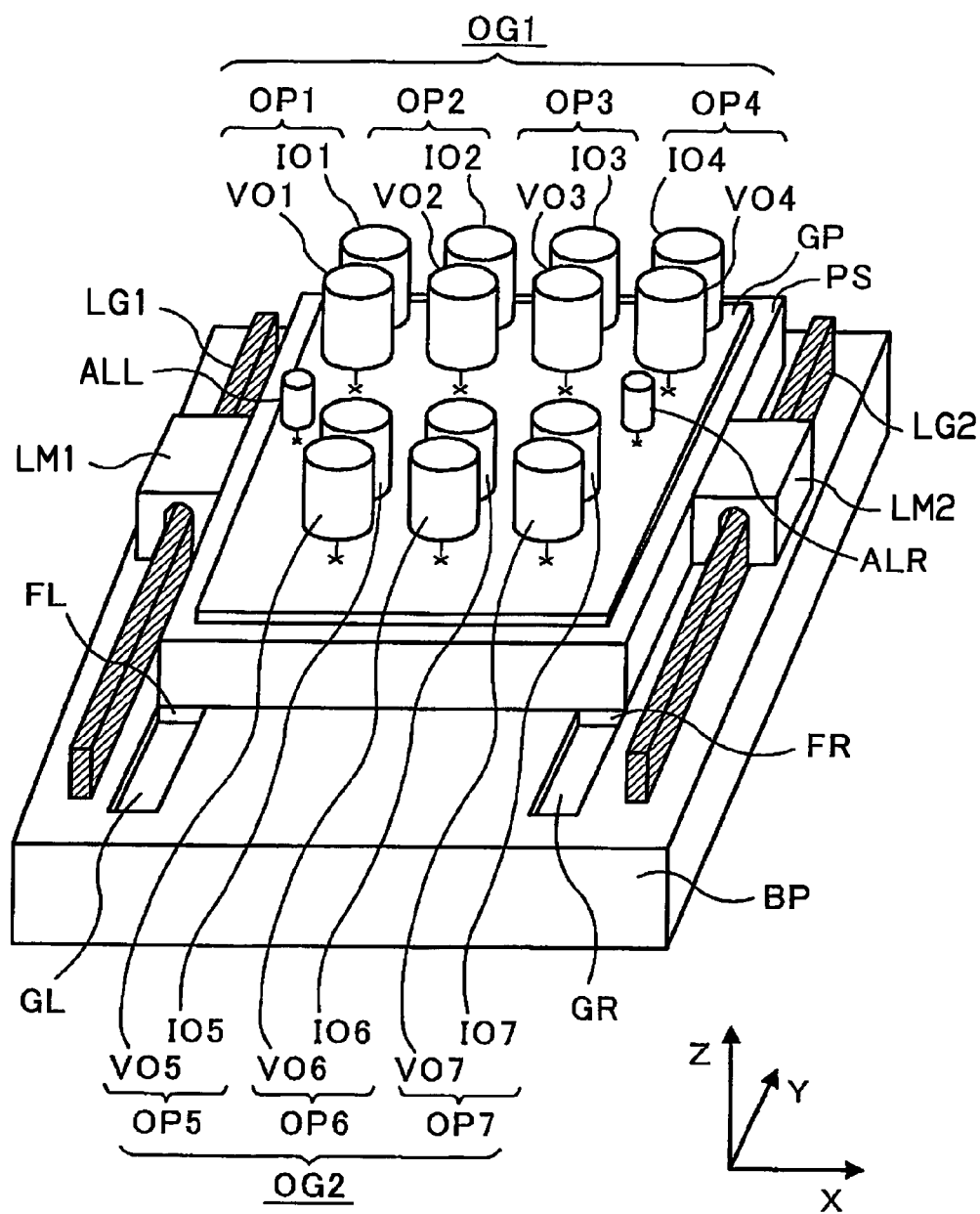
FIG. 1 is a diagram showing an example of an exposure apparatus according to the present invention.

FIG. 1 is a diagram showing a first example of an exposure apparatus according to the present invention.

A substrate stage PS holds a substrate GP, such as a glass substrate that forms a picture display portion of a flat panel display.

Above the substrate stage PS (+Z direction as viewed in the drawing), a first exposure optical group OG1 and a second exposure optical group OG2, which include a plurality of optical systems (hereafter referred to as "exposure optical systems") for exposing patterns onto the substrate GP on the substrate stage PS, are held by a frame portion (not shown).

The substrate stage PS is movable on a base plate BP along guide grooves GL and GR in a Y direction, as viewed in the drawing. The Y direction is one of the in-plane directions of the substrate GP. The substrate stage PS is an example of a movable mechanism enabling relative scanning of the first exposure optical group OG1 and the second exposure optical group OG2 with the substrate GP. The movement and position control of the substrate stage PS in the Y direction and fine movement and position control of the substrate stage PS in an X direction are performed by a linear motor system, which includes movable elements LM1 and LM2 arranged on the substrate stage PS and fixed elements LG1 and LG2 arranged on the base plate BP, and a position control system (not shown).

During exposure, the above-described exposure system moves the substrate GP in the Y direction with the linear motor system. This enables relative scanning of the first exposure optical system group OG1 and the second exposure optical system group OG2 with the substrate in the Y direction, which is an in-plane direction of the substrate GP, during exposure. That is, the so-called scanning exposure is enabled.

The scanning exposure enables the exposure of patterns on substantially the entire surface of the substrate GP in the Y direction even when using an exposure optical system having a small exposure field.

It is obvious that relative scanning may be performed by moving a frame including an exposure optical system in the Y direction.

The coordinate axes of the XYZ coordinates to indicate directions shown in FIG. 1 are used to facilitate the description. Thus, it is obvious that the coordinate axes of the exposure apparatus may be selected in any manner.

However, hereinafter, the directions of the XYZ coordinate axes of the exposure apparatus of the present example in each of the subsequent drawings are the same as the XYZ coordinate system of FIG. 1.

The first exposure optical system group OG1 includes a plurality of interference optical systems IO1, IO2, IO3, and IO4 and variable shaping optical systems VO1, VO2, VO3, and VO4. The second exposure optical system group OG2 includes a plurality of interference optical systems IO5, IO6, and IO6 and variable shaping optical systems VO5, VO6, and VO7. Further, position detection optical systems ALL and ALR for detecting positional information of a substrate pattern existing on the substrate GP is arranged between the first exposure optical system group OG1 and the second exposure optical system group OG2.

Figure 2A:
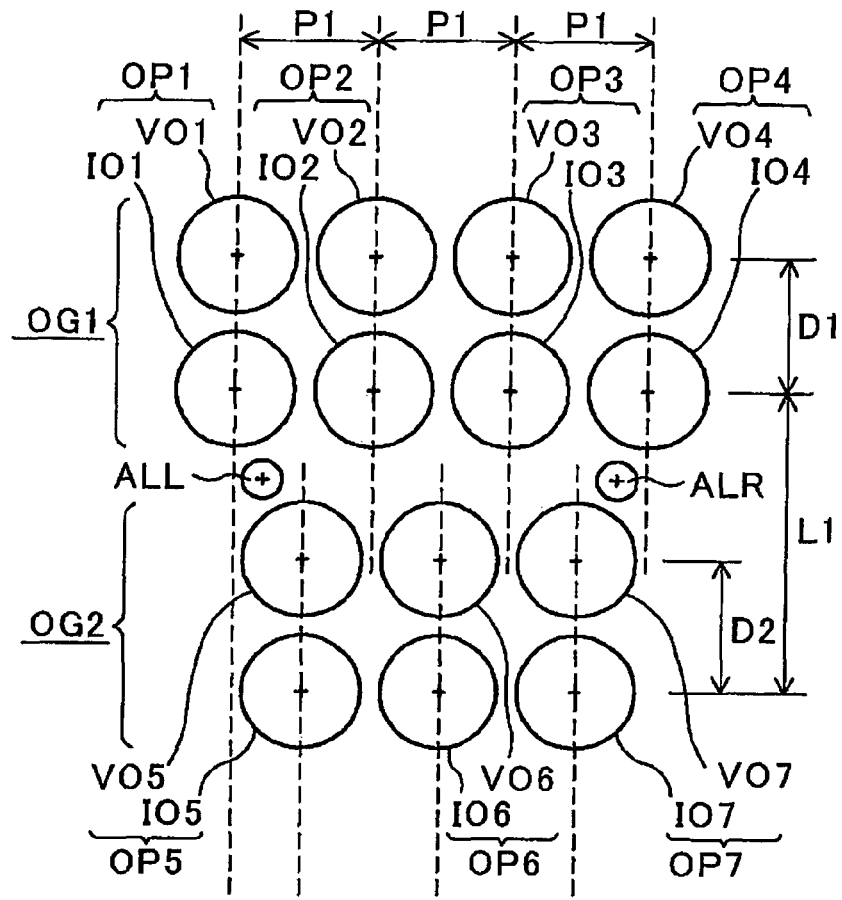
FIG. 2(A) is a diagram showing the layout of interference optical systems IO1 to IO7 and variable shaping optical systems VO1 to VO7.

The layout of the optical systems in the XY directions will now be described in detail with reference to FIG. 2(A).

The interference optical system IO1 and the variable shaping optical system VO1, which are arranged with an interval D1 therebetween in the Y direction, form an optical system set OP1. In the same manner, the other interference optical systems IO2 to IO7 and the variable shaping optical systems VO2 to VO7, which are arranged with an interval therebetween in the Y direction, form optical system sets OP2, OP3, OP4, OP5, OP6, and OP7, respectively.

The four optical system sets OP1 to OP4 are arranged at the same Y coordinate and at an interval P1 in the X direction to form the first exposure optical system group OG1. The remaining three optical system sets OP5 to OP7 are spaced from the first exposure optical system group OG1 in the Y direction by an interval L1 and arranged at the interval P1 in the X direction to form the second exposure optical system group OG2. In this state, the X coordinates of the optical system set OP1 and the optical system set OP5 are separated by interval P2, which is one half the interval P1.

To increase the processing capacity of the exposure apparatus, it is preferred that the interference optical systems IO1 to IO7 and the variable shaping optical systems VO1 to VO7 of the optical system sets OP1 to OP7 in the first exposure optical system group OG1 and the second exposure optical system group OG2 be arranged at positions enabling simultaneous exposure of the same substrate GP during the scanning exposure. When arranged at other positions, the exposure with the interference optical systems IO1 to IO7 and the exposure with the variable shaping optical systems VO1 to VO7 must always be performed at different times. This would drastically lower the processing capacity of the exposure apparatus.

Accordingly, to increase the processing capacity of the exposure apparatus, it is preferred that the interval D1 and interval D2 in the Y direction, which is the scanning direction, for the interference optical systems IO1 to IO7 and the variable shaping optical systems VO1 to VO7 of the optical system sets OP1 to OP7 in the first exposure optical system group OG1 and the second exposure optical system group OG2 be less than or equal to the length of the substrate GP in the Y direction. That is, it is preferred that the interval D1 and interval D2 be less than or equal to the length of the substrate stage PS in the Y direction.

To further increase the processing capacity of the exposure apparatus, it is preferred that the interval D1 and interval D2 be less than or equal to one fourth the length of the substrate GP in the Y direction.

The first exposure optical system group OG1 and the second exposure optical system group OG2 are arranged so that their Y direction positions are spaced by the predetermined interval L1 in order to avoid mechanical interference caused by the size of each exposure optical system, especially in the Y direction.

To eliminate unnecessary scanning operations and shorten the scanning time in order to increase the processing capacity of the exposure apparatus, it is preferred that the first exposure optical system group OG1 and the second exposure optical system group OG2 be arranged as close as possible to each other in the Y direction, or the scanning direction, while avoiding mechanical interference.

The number of the optical system sets OP1 to OP7, the interference optical systems IO1 to IO7, and the variable shaping optical systems VO1 to VO7 are not limited to seven as in the above example and may be any number including one.

The relationship of the optical system sets OP1 to OP7 and the corresponding exposure fields that are exposed on the substrate GP will now be described.

As described above, the exposure apparatus of the present example performs exposure on the substrate while performing relative scanning with the optical system sets OP1 to OP7 arranged at a plurality of X coordinates and the substrate GP in the Y direction.

Figure 2B:
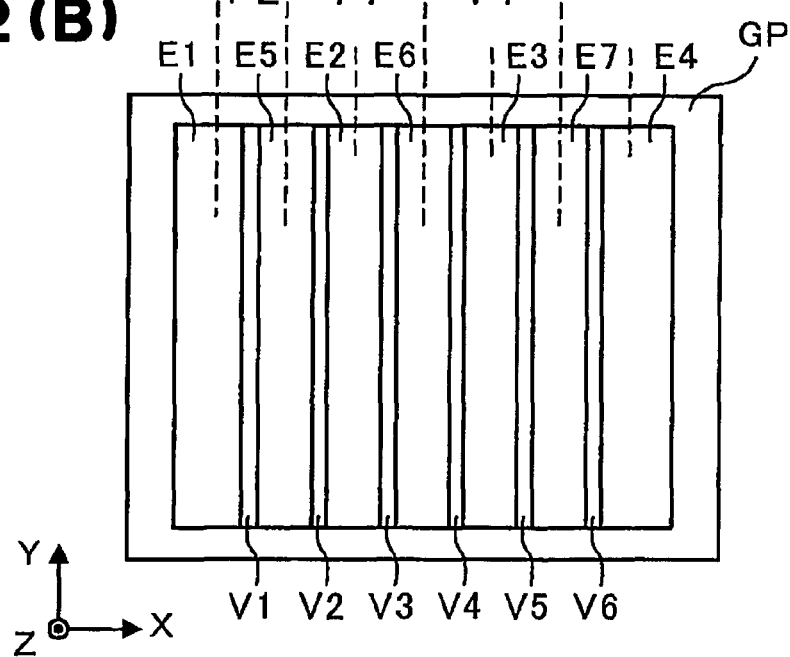
FIG. 2(B) is a diagram showing partial regions E1 to E7 on the substrate GP exposed by the exposure apparatus of the present example.

Accordingly, the scanning exposure forms on the substrate GP a plurality of partial regions exposed by the optical system sets OP1 to OP7. The partial regions each have a predetermined width in the X direction and extend in the Y direction. In FIG. 2, partial regions E1, E2, E3, E4, E5, E6, and E7 are respectively exposed by optical system sets OP1, OP2, OP3, OP4, OP5, OP6, and OP7.

Overlapping regions V1, V2, V3, V4, V5, and V6 may exist between the partial regions E1 to E7. In this case, for example, the overlapping region V1 is the region exposed in an overlapping manner by the two optical system sets OP1 and OP5 corresponding to the partial regions E1 and E5 that are adjacent to the overlapping region V1. In the same manner, the other overlapping regions V2 to V6 are regions exposed in an overlapping manner by two of the optical system sets OP2 to OP7 that are adjacent to each other in the X direction. The overlapping regions V1 to V6 will later be described in detail.

Next, the exposure performed by the optical system set OP1 at a certain position in the partial region E1 will be discussed.

First, a case in which the substrate GP is exposed and scanned in the +Y direction relative to the first exposure optical system group OG1 and the second exposure optical system group OG2. In this case, due to the layout of the interference optical system IO1 and the variable shaping optical system VO1 in the optical system set OP1, the variable shaping optical system VO1 first exposes a pattern onto a corresponding exposure target position. Then, the substrate GP is moved so as to arrange the exposure target position under the interference optical system IO1. Afterwards, the interference optical system IO1 exposes a pattern.

More specifically, the interference optical system IO1 and the variable shaping optical system VO1 are arranged in the Y direction, which is the scanning direction, and the substrate GP is scanned in the Y direction. As a result, the variable shaping optical system VO1 and the interference optical system IO1 perform composite exposure (dual exposure) on the partial region E1.

If the substrate GP is exposed and scanned in the −Y direction, the exposure order of the interference optical system IO1 and the variable shaping optical system VO1 are just switched. In this case, composite exposure (dual exposure) is also performed.

In addition to partial region E1, the other partial regions E2 to E7 also undergo composite exposure with the interference optical systems IO2 to IO7 and the variable shaping optical systems VO2 to VO7 in the same manner as described above.

Figure 3A:
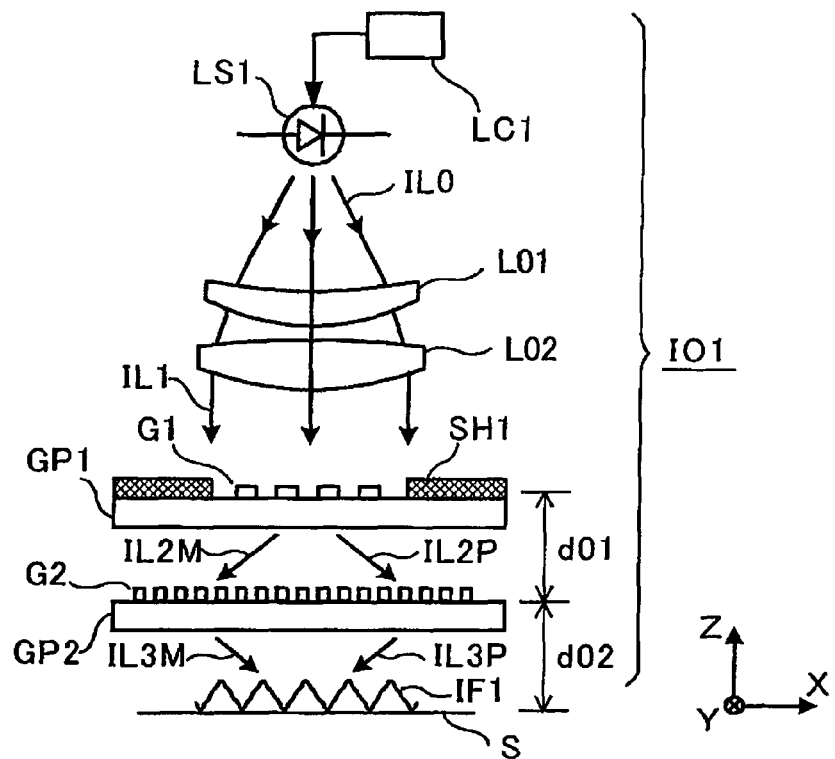
FIG. 3(A) is a cross-sectional view of the interference optical system IO1.

FIG. 3(A) is a cross-sectional view showing the structure of the interference optical system IO1. The other interference optical systems IO2 to IO7 each have a structure identical to the interference optical system IO1.

Exposure light IL0 is emitted from a light source LS1, which is formed by a laser, such as a semiconductor laser, a light emitting diode, or the like. A light emission controller LC1 controls the light source LS1 to start and stop the emission of the exposure light IL0. The exposure light IL0 is shaped by condenser lens L01 and L02 into exposure light IL1.

Under the condenser lens L02 and in the optical path of the exposure light IL1, a first light transmission plate GP1, which includes a first grating G1, and a second light transmission plate GP2, which includes a second grating G2, are arranged from the upstream side in that order along the travel direction of the exposure light IL1.

The first grating G1 may be a phase grating in which light transmissive dielectric members extending in the Y direction on the first light transmission plate GP1 are arranged in the X direction at period P01. In the same manner, the second grating G2 may be a phase grating in which light transmissive dielectric members extending in the Y direction on the second light transmission plate GP2 are arranged in the X direction at period P02.

The dielectric members forming the first grating G1 and the second grating G2 each have a thickness set so that a phase difference of n [rad] occurs between the illumination light transmitted through the dielectric member and the exposure light transmitted through portions without the dielectric member.

The interval between the first grating G1 and the second grating G2 is a first distance d01. During exposure, the substrate GP is arranged on a predetermined surface S spaced from the second grating G2 at an interval that is a second distance d02.

Figure 3B:
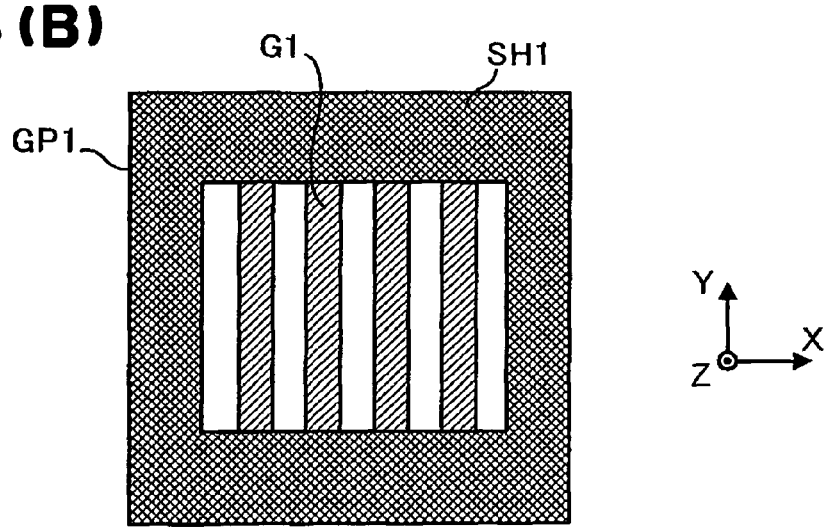
FIG. 3(B) is a plan view showing a first light transmission plate GP1.

FIG. 3(B) is a plan view (taken from the +Z direction) of the first light transmission plate GP1.

The first light transmission plate GP1 has a central portion, which is a rectangular region, and a peripheral portion. The first grating G1 is formed in the central portion, and a light shield SH1 made of chromium is formed in the peripheral portion.

When the exposure light IL1 irradiates the first grating G1, the first grating generates diffraction lights of which main components are +1st order diffraction light IL2P and −1st order diffraction light IL2M. The +1st order diffraction light IL2P and the −1st order diffraction light IL2M enter the second grating G2 to be respectively diffracted into a first diffraction light IL3P and a second diffraction light IL3M.

The two diffraction lights IL3P and IL3M form an interference fringes IF1 on a plane S, which is spaced from the second grating G2 by the second distance d02. Period P03 of the intensity distribution in the interference fringes IF1 is expressed as shown below.

$$P03 = P01 \times P02 / \{2 \times (P01 - P02)\} \qquad \text{Equation 1}$$

In this manner, the interference optical system IO1 exposes an exposure pattern of the interference fringes IF1 having the period P03 in the X direction onto the substrate GP, which is arranged at plane S. The periodic direction of the interference fringes IF1 is the X direction. Therefore, the bright-dark pattern distribution of the interference fringes IF1 is parallel to the Y direction that is orthogonal to the X direction. That is, the distribution of the interference fringes IF1 is parallel to the scanning direction.

The range (size in the XY in-plane direction) of the interference fringes IF1 that is formed on the plane S is substantially the same as the range of the first grating G1 formed in the first transmission plate GP1.

The exposure apparatus of the present example performs exposure while scanning the substrate GP in the Y direction relative to the interference optical system IO1. Thus, the exposure pattern exposed onto the substrate GP by the interference optical system IO1 is equivalent to an enlargement of the dark-bright pattern of the interference fringes IF1 in the Y direction. The periodic direction of the interference fringes IF1 is in the X direction. Thus, the scanning exposure in the Y direction, which is orthogonal to the X direction does not lower the contrast of the interference fringes IF1.

When the light emitting portion of the light source LS1 has a width in the X direction, the width lowers the contrast of the interference fringes IF1. Thus, it is preferable that a light source having a light emitting portion with a small width especially in the X direction be used as light source LS1.

Contrast decrease is effectively minimized when the period P01 of the first grating G1 is set to be two times as large as the period P02 of the second grating G2 and the first distance d01 and second distance d02 are set to be equal.

Contrast decrease may also be minimized by setting the period P01 of the first grating G1 to be two times as large as the period P02 of the second grating G2 and setting the first distance d01 and second distance d02 to be equal. In this case, the period P03 of the intensity distribution of the interference fringes IF1 becomes equal to the period of the second grating G2 or one half the period of the first grating G1.

It is preferred that the period of the interference fringes IF1 exposed onto the substrate GP be variable in accordance with the type of the substrate GP. Thus, it is preferred that the interference optical systems IO1 to IO7 have a replacing mechanism enabling replacement of the first light transmission plate GP1 and the second light transmission plate GP2.

The replacing mechanism may include a holding mechanism (not shown), which holds the first light transmission plate GP1 and the second light transmission plate GP2, and a mechanism for transporting the first transmission plate GP1 and the second transmission plate GP2 to the holding mechanism. In such a case, it is preferable that the holding mechanism include reference pins or position sensors for positioning the first light transmission plate GP1 and the second light transmission plate GP2.

The structure of the variable shaping optical systems VO1 to VO7 in the present example will now be described.

Figure 4A:
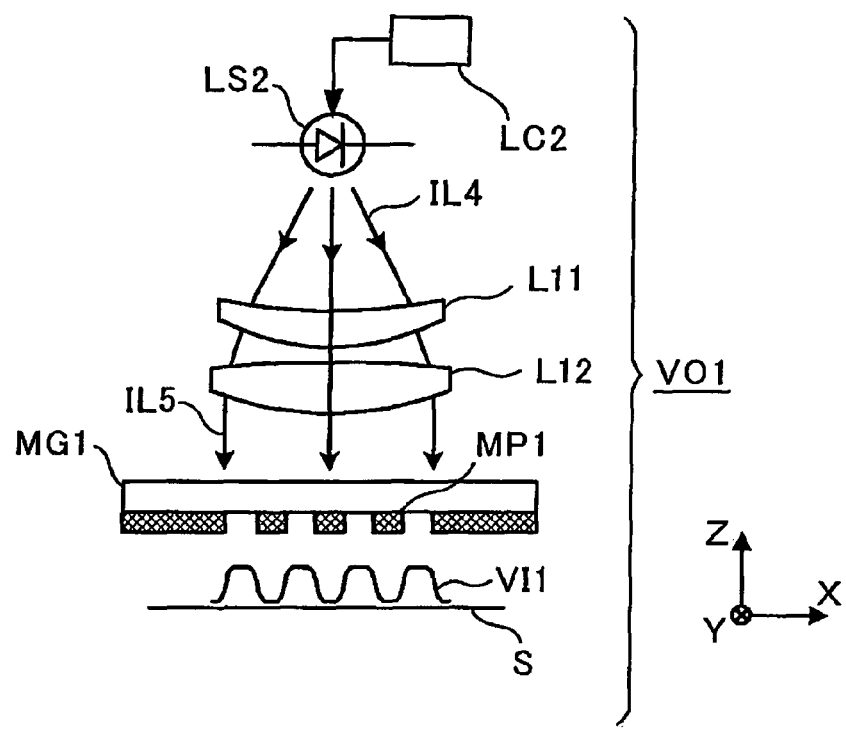
FIG. 4(A) is a cross-sectional view if the variable shaping optical system VO1.

FIG. 4(A) is a cross-sectional diagram showing the structure of the variable shaping optical system VO1. The other variable shaping optical systems VO2 to VO7 each have a structure identical to the variable shaping optical system VO1.

Exposure light IL4 is emitted from a light source LS2, which is formed by a laser, such as a semiconductor laser, a light emitting diode, or the like. A light emission controller LC2 controls the light source LS2 to start and stop the emission of the exposure light IL4. The exposure light IL4 is shaped by condenser lens L11 and L12 into exposure light IL5, which irradiates a mask MG1 having a mask pattern MP1.

In the present example, the light source LS2 is arranged in an optical path of the exposure light and forms a switching mechanism which enables timesharing switching between states in which the substrate GP is irradiated with exposure light and the substrate GP is not irradiated with exposure light.

Figure 4B:
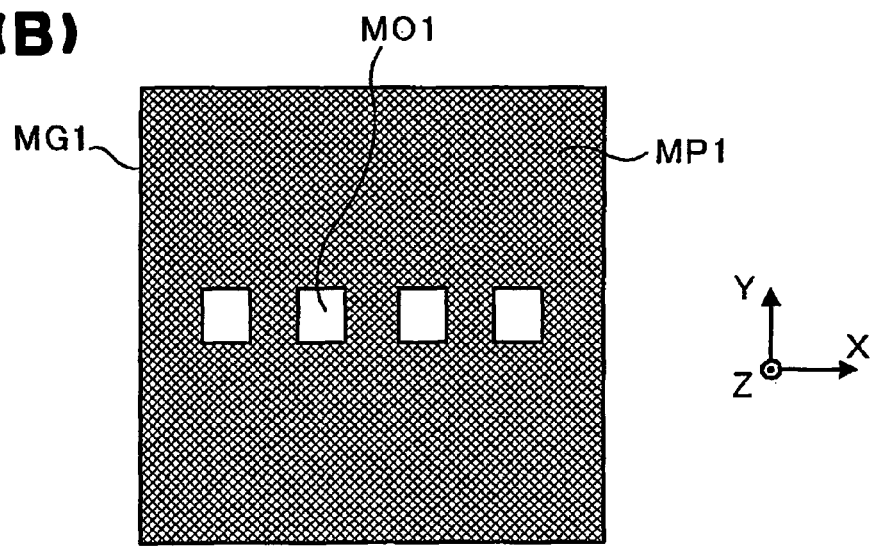
FIG. 4(B) is a plan view showing a mask MG1.

FIG. 4(B) is a plan view (taken from the +Z direction) of the mask MG1, which is an example of a beam dividing mechanism that generates the exposure light, which irradiates the substrate GP, from light formed by a plurality of beam spots.

The mask MG1, which is formed from a light transmissive substrate such as glass, has a lower surface. A plurality of light transmission portions MO1 arranged in the X direction on the lower surface of the mask. A light shield portion MP1 made of chromium or the like surrounds the light transmission portions MO1.

When the exposure light IL5 irradiates the mask MG1, exposure light is transmitted through the light transmission portions MO1 of the mask MG1 but is not transmitted through other portions (i.e., sections in which the light shield portion MP1 is formed).

Consequently, light distribution V11 of the exposure light is formed in accordance with the shape of the light transmission portions MO1 on a plane S, which is located in the vicinity of the mask MG1. Accordingly, arrangement of the substrate GP at the plane S enables a plurality of beam spots of the exposure light to be formed on the substrate GP. The number of beam spots may be varied by varying the number of light transmission portions MO1 formed on the mask MG1, so a single light transmission portion MO1 may be provided to form one beam spot instead of multi light transmission portion.

The exposure apparatus of the present example performs exposure while scanning the substrate GP in the Y direction relative to the variable shaping optical system VO1. Thus, the exposure pattern exposed onto the substrate GP by the variable shaping optical system VO1 is an enlargement in the Y direction of the beam spots formed by the light transmission portions MO1.

It is preferable that the positions and shapes of the beam spots that expose the substrate GP be variable in accordance with the type of the substrate. Thus, it is preferred that the variable shaping optical systems VO1 to VO7 include replacing mechanism enabling attachment of a plurality of masks having different mask patterns in a replaceable manner.

The replacing mechanism may include a holding mechanism (not shown) for holding the mask MG1 and a mechanism for transporting the mask MG1 to the holding mechanism. In such a case, it is preferable that the holding mechanism include reference pins or position sensors for positioning the mask MG1.

During the scanning of the substrate GP in the Y direction, the light source LS2 of the variable shaping optical system VO1 is controlled so that the emission of light is started and stopped in accordance with the relative positions of the variable shaping optical system VO1 and the substrate GP. This enables the shape of the pattern exposed onto the substrate GP to be variable in the Y direction.

The switching mechanism that enables timesharing switching between states in which the substrate GP is irradiated with exposure light and the substrate GP is not irradiated with exposure light is not limited to one that controls the light source LS2 so as to start and stop the emission of light. The switching mechanism may be arranged in the optical path between the light source LS2 and the substrate GP (plane S) as a mechanical shutter or a shutter including a so-called electro-optic device implementing an electro-optic effect.

The interference optical system is advantageous in that it enables exposure of a fine periodic pattern even though it is an inexpensive optical system. Further, even if the substrate is somewhat separated from the predetermined plane S in the Z direction, a dark-bright pattern having a sufficiently high contrast can be exposed.

The exposure apparatus of the present example performs composite exposure on the substrate GP with both of the interference optical systems IO1 to IO7 and the variable shaping optical systems VO1 to VO7. Hereafter, a first example of an exposure method using the exposure apparatus of the present example for exposing an exposure pattern (composite pattern) finally onto the substrate GP will be discussed with reference to FIG. 5.

FIG. 5(A) is a diagram showing part of mask pattern including light transmission portions MO2, light shield portions MP21, and light shield portions MP22, which are formed on a mask MG2 of the variable shaping optical system VO1.

An example of the mask MG2 includes a plurality of rectangular light transmission portions MO2 arranged in the X direction. A light shield portion MP21 is arranged adjacent to each of the two Y direction sides of a light transmission portion MO2. A light shield portion MP22 is arranged adjacent to each of the two X direction sides of a light transmission portion MO2. The light shield portion MP22 is a light shield portion that extends along the entire surface in the Y direction as viewed in FIG. 5(A) and has a width W22 in the X direction. Further, the light shield portions MP22 and light transmission portions MO2 are arranged at an interval P22 between the centers of the light shield portions MP22 (hereinafter "central interval") in the X direction. The light transmission portions MO2 are arranged at the central interval P22 in the X direction.

FIG. 5(B) is a diagram showing part of an exposure pattern PV2 exposed onto the substrate GP by the variable shaping optical system VO1, which includes the mask MG2 shown in FIG. 5(A). In the diagram, the hatched sections represent portions (hereafter, referred to as "dark portions") at which the amount of exposure light is less than the amount required for resist to completely respond to the exposure light (hereafter referred to as "reference exposure light amount"). The sections that do not include hatchings represent portions (hereafter, referred to as "bright portions") at which the amount of exposure light is greater than the reference exposure light amount.

The substrate GP is exposed while being scanned in the Y direction relative to the variable shaping optical system VO1. Thus, portions on the substrate GP having X coordinates that are the same as the X coordinates of the light transmission portions MO2 are irradiated by exposure light during the scanning exposure to form bright portions BS22. Portions having X coordinates that are the same as the X coordinates of the light shield portions MP22 are not irradiated by exposure light during the scanning exposure and thus form dark portions DL22.

In this state, the dark portions DL22 each have a width W23 in the X direction, which is about the same as the width W22 of the light shield portions MP22 of the mask MG2 in the X direction. Further, the central interval of the dark portions DL22 in the X direction is the same as the central interval P22 of the light shield portions MP22 in the X direction.

The exposure pattern exposed onto the substrate GP by the interference optical system IO1 in the present example will now be described.

FIG. 5(C) is a diagram showing part of an exposure pattern exposed onto the substrate by the interference optical system IO1 of the present example. As described above, an exposure pattern PI2 formed by the interference optical system IO1 is a periodic pattern in which bright linear portions BS21, which are bright lines, and dark linear portions DL21, which are dark lines, are repetitively arranged at a central interval P21 in the X direction. The dark linear portions DL21 each have a width W21 in the X direction. The width W21 may be varied in accordance with the amount of exposure light irradiated on the substrate GP by the interference optical system IO1. The value of the width W21 is about one half the central interval P21.

The central interval P21 is set to be a fraction of an integer, for example, one fourth, of the central interval P22 of the dark portions DL22 in the X direction. Such setting may be made by setting the period of the grating arranged in the interference optical system IO1 or by adjusting the central interval P22 of the light shield pattern MP22 on the mask MG2.

An exposure pattern PS2, which is a composite pattern of the exposure pattern PI2 formed by the interference optical system IO1 and the exposure pattern PV2 formed by the variable shaping optical system VO1 will now be described with reference to FIG. 5(D).

Portions of an exposure pattern defining bright portions exposed by either one of the interference optical system IO1 and the variable shaping optical system VO1 and become bright portions BS23 in the exposure pattern PS2. Accordingly, in the exposure pattern PS2, dark linear portions DL23 are defined by portions that are dark in both of the exposure pattern PI2 and exposure pattern PV2. The dark linear portions DL23 each have a width of W21 in the X direction.

Therefore, in the first example of the present exposure method, every predetermined number of dark linear portions, for example, every fourth dark linear portion DL21 in the exposure pattern PI2 of the interference optical system IO1, remains as the dark linear portions DL23 in the exposure pattern PS2.

As described above, in the first example, the interference optical system IO1 exposes fine periodic patterns with high accuracy, and the variable shaping optical system VO1 selectively leaves desired patterns in the periodic pattern. This enables a pattern having a fine line width and a relatively large central interval to be accurately exposed with a simple apparatus.

A second example of an exposure method using the present exposure apparatus for exposing an exposure pattern (composite pattern) finally onto the substrate GP will now be discussed with reference to FIGS. 6 and 7.

Figure 6:
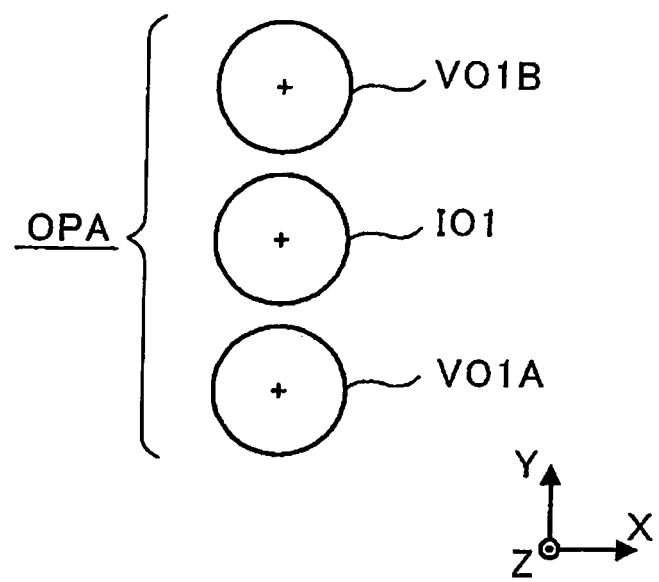
FIG. 6 is a diagram showing a modification of an optical system set.
Figure 7:
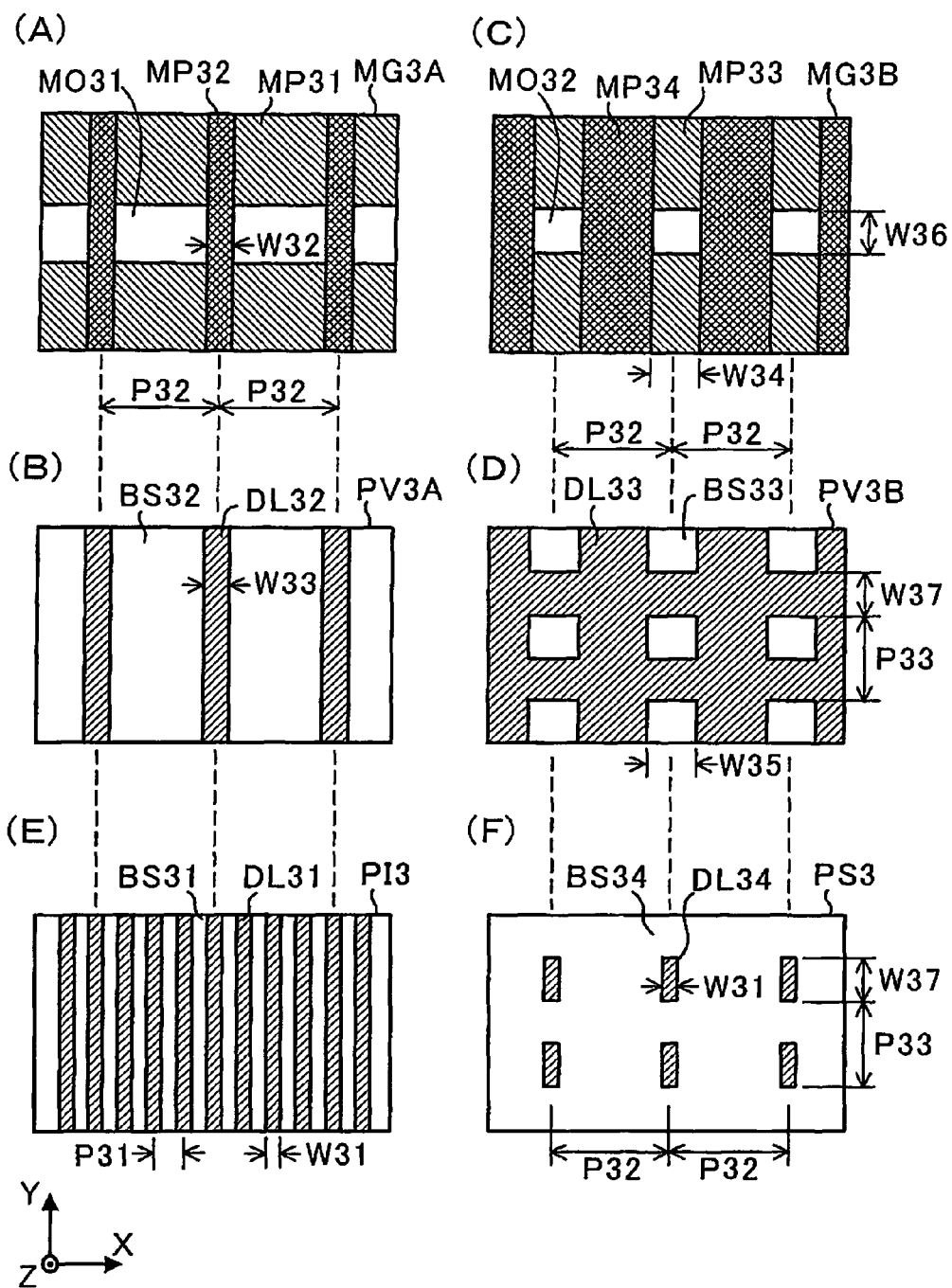
FIG. 7 is a diagram showing a second example of an exposure method according to the present invention.

In the present example, an optical system set OPA shown in FIG. 6 is used in lieu of the optical system sets OP1 to OP7 shown in FIGS. 1 and 2. The optical system set OPA includes one interference optical system IO1 and two or more variable shaping optical systems VO1A and VO1B that are arranged in the Y direction. Accordingly, the exposure light on the substrate GP is composite exposure light formed by the three optical systems.

The variable shaping optical systems VO1A and VO1B and the interference optical system IO1 each have a structure that is identical to the optical systems shown in FIGS. 3 and 4.

In FIG. 6, the optical systems are arranged in the Y direction in the order of the variable shaping optical systems VO1A, the interference optical system IO1, and the variable shaping optical system VO1B. However, the optical systems may be arranged in any order.

The exposure pattern exposed onto the substrate GP by the variable shaping optical system VO1A in the present example will first be described.

FIG. 7(A) is a diagram showing part of mask pattern including light transmission portions MO31, light shield portions MP31, and light shield portions MP32, which are formed on a mask MG3A of the variable shaping optical system VO1A.

An example of the mask MG3A includes a plurality of rectangular light transmission portions MO31 arranged in the X direction. A light shield portion MP31 is arranged adjacent to each of the two Y direction sides of a light transmission portion MO31. A light shield portion MP32 is arranged adjacent to each of the two X direction sides of a light transmission portion MO31. The light shield portion MP32 is a light shield portion that extends along the entire surface in the Y direction as viewed in FIG. 7(A) and has a width W32 in the X direction. Further, the light shield portions MP32 and light transmission portions MO31 are arranged at a central interval of P32 in the X direction.

FIG. 7(B) is a diagram showing part of an exposure pattern PV3A exposed onto the substrate GP by the variable shaping optical system VO1A, which includes the mask MG3A shown in FIG. 7(A).

The shape of the mask MG3A is substantially the same as that of the mask pattern of the mask MG2 in the first example of the exposure method shown in FIG. 5(A). Thus, an exposure pattern PV3A is also similar to the exposure pattern PV2 of the first example of the exposure method shown in FIG. 5(B).

Therefore, portions on the substrate GP having X coordinates that are the same as the X coordinates of the light transmission portions MO31 are irradiated by exposure light during the scanning exposure to form bright portions BS32. Portions having X coordinates that are the same as the X coordinates of the light shield portions MP32 are not irradiated by exposure light during the scanning exposure and thus form dark portions DL32.

The dark portions DL32 each have a width W33 in the X direction, which is about the same as the width W32 of the light shield portions MP32 of the mask MG3A in the X direction. Further, the central interval of the dark portions DL32 in the X direction is the same as the central interval P32 of the light shield portions MP32 in the X direction.

The exposure pattern exposed onto the substrate GP by the variable shaping optical system VO1B in the present example will now be described.

FIG. 7(C) is a diagram showing part of a mask pattern formed in a mask MG3B arranged in the variable shaping optical system VO1B. The mask pattern includes light transmission portions MO32, light shield portions MP33, and light shield portions MP34. Although there are portions having different widths, the basic layout of the pattern in the mask MG3B is similar to the pattern of the mask MG3A shown in FIG. 7(A).

The central interval of the light transmission portions MO32 and light shield portions MP34 arranged in the X direction is set to be the same as the central interval P32 of the light shield portions MP32 in the mask MG3A shown in FIG. 7(A).

The light transmission portions MO32 each have a width W34 in the X direction. The width W34 is set to be 1.5 to 2.5 times greater than the width W33 of the light shield portions MP32 in the mask MG3A of FIG. 7(A).

During exposure of the substrate GP with the variable shaping optical system VO1B, the emission of light from a light source (the light source LS2 shown in FIG. 4) of the variable shaping optical system VO1B is repetitively started and stopped in a timesharing manner.

More specifically, when scanning exposure is being performed by the variable shaping optical system VO1B and the substrate GP, a control mechanism (not shown) issues a command to the light emission controller LC2 so that the emission of light from the light source LS2 shown in FIG. 4 is repetitively started and stopped whenever a predetermined time elapses or whenever scanning is performed for a predetermined distance. As a result, the variable shaping optical system VO1B repeats states in which it irradiates the substrate GP with exposure light and does not irradiate the substrate GP with exposure light in a timesharing manner.

An example of an exposure pattern PV3B exposed onto the substrate GP by the variable shaping optical system VO1B through such exposure is shown in FIG. 7(D). Portions on the substrate GP located immediately below the light transmission portions MO32 when the light source LS2 is emitting light form a plurality of bright portions BS33, which are discrete rectangular sections. Other portions of the substrate GP form dark portions DL33.

In this state, the bright portions BS33 each have a width W35 in the X direction that is substantially the same as the width W34 of the light transmission portion MO32 in the X direction. The bright portions BS33 are arranged in the Y direction at a central interval P33, which is determined by the time interval at which the light emission controller LC2 repetitively starts and stops the emission of light from the light source LS2 and the speed of the substrate stage PS when the substrate GP is scanned.

Accordingly, the central interval P33 may be controlled by controlling the light emission interval of the light source LS2 and/or the scanning speed of the substrate stage PS. Further, the duty ratio of the light source LS2, which determines the time of light emission and the time light emission is stopped, may be controlled so that a dark portion formed between the bright portions BS33 in the Y direction may have a controlled Y direction width W37.

It is preferred that the light transmission portions MO32 in the mask MG3B each have a width W36 in the Y direction that is set to be smaller than the Y direction width of the bright portions BS33 in the exposure pattern PV3B, that is, a value obtained by subtracting the Y direction width W37 of the dark portions formed between the bright portions BS33 from the central interval P33 of the bright portions BS33. If the width W36 of the light transmission portions MO32 in the Y direction becomes larger, the formation of the bright portions BS33 with the desired Y direction width will become difficult.

An exposure pattern exposed onto the substrate GP by the interference optical system IO1 in the present example will now be described. The exposure pattern is similar to that in the first example of the exposure method.

FIG. 7(E) is a diagram showing part of an exposure pattern PI3 exposed onto the substrate by the interference optical system IO1 of the present example. The exposure pattern PI3 is a periodic pattern in which bright linear portions BS31, which are bright lines, and dark linear portions DL31, which are dark lines, are repetitively arranged at a central interval P31 in the X direction. The dark linear portions DL31 each have a width W31 in the X direction.

The central interval P31 is set to be a fraction of an integer, for example, one fourth, of the central interval P32 in the X direction of the dark portions DL32 shown in FIG. 7(B) and the central interval P32 in the X direction of the bright portions BS33 shown in FIG. 7(D). Such setting may be made by setting the period of the grating arranged in the interference optical system IO1 or by adjusting the central interval of the mask MG3A arranged in the variable shaping optical system VO1A and the light shield pattern of the mask MG3B arranged in the variable shaping optical system VO1B.

An exposure pattern PS3, which is a composite pattern obtained through composite exposure by the three optical systems IO1, VO1A, and VO1B will now be described with reference to FIG. 7(F).

In this example, portions of an exposure pattern defining bright portions exposed by the interference optical system IO1 or either one of the variable shaping optical system VO1A and VO1B also become bright portions BS34 in the exposure pattern PS3. Accordingly, in the exposure pattern PS3, dark linear portions DL34 are defined by portions that are dark in each of the exposure pattern PI3, the exposure pattern PV3A, and the exposure pattern PV3B. The dark linear portions DL34 each have a width of W31 in the X direction.

Therefore, in the second example of the present exposure method, every predetermined number of dark linear portions, for example, every fourth dark linear portion DL31 in the exposure pattern PI3 of the interference optical system IO1 may be selected, with only certain regions of the selected portions in the Y direction forming the dark linear portions DL34.

As described above, in the second example of the present exposure method, the interference optical system IO1 exposes fine periodic patterns with high accuracy. Further, the variable shaping optical systems VO1A and VO1B select the desired pattern from the periodic patterns as certain dark linear portions and then limits the selected dark linear portions to certain regions in the Y direction that have the desired width. This enables a two-dimensionally-shaped pattern having a fine line width and a relatively large central interval to be accurately exposed with a simple apparatus.

A third example of an exposure method using the present exposure apparatus for exposing an exposure pattern (composite pattern) onto a substrate GP will now be discussed with reference to FIG. 8.

The third embodiment of the present exposure method is identical to the second example of the above exposure method in many parts. Thus, only parts that differ from the second example of the exposure method will be described.

In the same manner as the second example of the exposure method, the present example uses an optical system set OPA, which includes one optical system IO1 and two or more variable shaping optical systems VO1A and VO1B that are arranged in the Y direction. Accordingly, the exposure light on the substrate GP is composite exposure light formed by the three optical systems.

The exposure pattern exposed onto the substrate GP by the variable shaping optical system VO1A in the present example will first be described.

FIG. 8(A) is a diagram showing part of mask pattern including light transmission portions MO41, light shield portions MP41, and light shield portions MP42, which are formed on a mask MG4A of the variable shaping optical system VO1A in the present example.

The light shield portion MP42 is a light shield portion that extends along the entire surface in the Y direction as viewed in FIG. 8(A) and has a width W42 in the X direction. Further, the light shield portions MP42 and light transmission portions M41 are arranged at a central interval of P42 in the X direction.

FIG. 8(B) is a diagram showing part of an exposure pattern PV4A exposed onto the substrate GP by the variable shaping optical system VO1A, which includes the mask MG4A shown in FIG. 8(A).

Portions on the substrate GP having X coordinates that are the same as the X coordinates of the light transmission portions MO41 are irradiated by exposure light during the scanning exposure to form bright portions BS42. Portions having X coordinates that are the same as the X coordinates of the light shield portions MP42 are not irradiated by exposure light during the scanning exposure and thus form dark portions DL42.

The dark portions DL42 each have a width W43 in the X direction, which is about the same as the width W42 of the light shield portions MP42 of the mask MG4A in the X direction. Further, the central interval of the dark portions DL42 in the X direction is the same as the central interval P42 of the light shield portions MP42 in the X direction.

The exposure pattern exposed onto the substrate GP by the variable shaping optical system VO1B in the present example will now be described.

FIG. 8(C) is a diagram showing part of a mask pattern formed in a mask MG4B arranged in the variable shaping optical system VO1B. The mask pattern includes light transmission portions MO42, light shield portions MP43, and light shield portions MP44. The pattern in the mask MG4B is similar to the pattern of the mask MG3B shown in FIG. 7(A).

The central interval of the light transmission portions MO42 and light shield portions MP44 arranged in the X direction is set to be the same as the central interval P42 of the light shield portions MP42 in the mask MG4A shown in FIG. 8(A).

The light transmission portions MO42 each have a width W44 in the X direction. The width W44 is set to be at least 1.1 times greater than the width W42 of the light shield portions MP42 in the mask MG4A of FIG. 8 (A). The width W44 of the light transmission portions MO42 in the X direction may further be increased so as to continuously form the light transmission portions MO42 in the X direction and form a single light transmission portion.

In the same manner as the second example of the exposure method, during exposure of the substrate GP with the variable shaping optical system VO1B, the emission of light from a light source (the light source LS2 shown in FIG. 4) of the variable shaping optical system VO1B is repetitively started and stopped in a timesharing manner.

An example of an exposure pattern PV4B exposed onto the substrate GP by the variable shaping optical system VO1B through such exposure is shown in FIG. 8(D). Portions on the substrate GP located immediately below the light transmission portions MO42 when the light source LS2 is emitting light form a plurality of bright portions BS43, which are discrete rectangular sections. Other portions of the substrate GP form dark linear portions DL43.

In this state, in the same manner as the second example of the exposure method, the central interval P43 may be controlled by controlling the light emission interval of the light source LS2 and the scanning speed of the substrate stage PS. Further, the duty ratio of the light source LS2, which determines the time of light emission and the time light emission is stopped, may be controlled so that a dark portion formed between the bright portions BS43 in the Y direction may have a controlled Y direction width W47.

An exposure pattern exposed onto the substrate GP by the interference optical system IO1 in the present example will now be described. The exposure pattern is similar to that in the second example of the exposure method.

FIG. 8(E) is a diagram showing part of an exposure pattern PI4 exposed onto the substrate by the interference optical system IO1 of the present example. The exposure pattern PI4 is a period pattern in which bright linear portions BS41, which are bright lines, and dark linear portions DL41, which are dark lines, are repetitively arranged at a central interval P41 in the X direction. The dark linear portions DL41 each have a width W41 in the X direction.

The central interval P41 is set to be a fraction of an integer, for example, one fourth, the central interval P42 in the X direction of the dark portions DL42 shown in FIG. 8(B) and the central interval P42 of the bright portions BS43 shown in FIG. 8(D).

Further, in the third example of the present exposure method, the width W42 in the X direction of the light shield portion MP42 of the mask MG4A arranged in the variable shaping optical system VO1A is set to be at least 1.5 times greater and at most approximately 2.5 times greater than the central interval P41 of the dark linear portions DL41 in the X direction. As will be described later, this shields two of the dark linear portions DL arranged adjacently in the X direction with the light shield portions MP42 and leaves the other dark linear portions DL as they are in the exposure pattern compositely exposed by the variable shaping optical system VO1A and the interference optical system IO1.

Such setting may be made by setting the period of the grating arranged in the interference optical system IO1 or by adjusting the central interval of the mask MG4A arranged in the variable shaping optical system VO1A and the light shield pattern of the mask MG4B arranged in the variable shaping optical system VO1B.

An exposure pattern PS4, which is a composite pattern obtained through composite exposure by the three optical systems IO1, VO1A, and VO1B will now be described with reference to FIG. 8(F).

In this example, portions of an exposure pattern defining bright portions exposed by the interference optical system IO1 or either one of the variable shaping optical system VO1A and VO1B also become bright portions BS44 in the exposure pattern PS3. Accordingly, in the exposure pattern PS4, dark portions DL44 are defined by portions that are dark in each of the exposure pattern PI4, the exposure pattern PV4A, and the exposure pattern PV4B.

Therefore, in the third example of the present exposure method, every predetermined number of dark linear portions, for example, two adjacent ones of every fourth dark linear portion DL41 in the exposure pattern PI4 of the interference optical system IO1 may be selected, with only certain regions of the selected portions in the Y direction forming the dark linear portions DL44.

It is obvious that the width W42 of the light shield portion MP42 of the mask MG4A arranged in the variable shaping optical system VO1A may be further widened in order to shield three or more adjacent dark portions DL41, that is, to select a certain dark line portion.

As described above, in the third example of the present exposure method, the interference optical system IO1 exposes fine period patterns with high accuracy. Further, the variable shaping optical systems VO1A and VO1B select a plurality of adjacent desired patterns from the period patterns and shapes them into certain regions having the desired width in the Y direction. This enables a two-dimensionally-shaped pattern having a fine line width and a relatively large central interval to be accurately exposed with a simple apparatus.

In each of the above examples, the mask patterns and exposure patterns in the drawings show only some of the patterns, such as the mask MG2 or the partial region E1. It is thus obvious that exposure patterns, such as the partial regions E1, are formed on the entire surface. It is also obvious that the plurality of optical system sets OP1 to OP7 may form a plurality of exposure patterns on substantially the entire surface of the substrate GP.

Further, it is obvious that the exposure method of each of the above examples may be used in combination with a positive resist or a negative resist.

In each of the above examples of the exposure method, it is crucial that the exposure patterns formed by the interference optical systems IO1 to IO7 and the exposure patterns formed by the variable shaping optical systems VO1 to VO7 be accurately aligned and composed on the substrate GP.

Therefore, it is preferable that the interference optical systems IO1 to IO7 include a position adjustment mechanism enabling fine adjustment in the X direction position of at least either one of the first grating G1 and the second grating G2. It is also preferable that the position adjustment mechanism enable fine adjustment of rotation about the Z axis for at least either one of the first grating G1 and the second grating G2.

Further, it is preferable that the variable shaping optical systems VO1 to VO7 include position adjustment mechanisms enabling fine adjustment of the X direction position of the mask MG1 and position adjustment mechanisms enabling fine adjustment of the Y direction position of the mask MG1.

Exposure patterns may be aligned with one another by using a fine adjustment mechanism that enables position adjustment in the XY direction of the interference optical systems IO1 to IO7 or the variable shaping optical systems VO1 to VO7.

The exposure apparatus of the present example includes the plurality of optical system sets OP1 to OP7, divides the entire surface of the substrate GP into the partial regions E1 to E7, and exposes each of the partial regions E1 to E7 with the corresponding optical system sets OP1 to OP7.

Accordingly, it is preferable that the interference optical systems IO1 to IO7 and the variable shaping optical systems VO1 to VO7 respectively have exposure view fields including the partial regions E1 to E7 that are to be exposed in the X direction. Further, it is preferable that the exposure view fields be shaped to have two sets of parallel sides in the X direction and Y direction to form a rectangle.

However, in the exposure apparatus of the present example, overlapping regions V1, V2, V3, V4, V5, and V6 may be formed between the partial regions E1 to E7 of the substrate GP. As described above, for example, the overlapping region V1 shown in FIG. 2 is a region that is exposed in an overlapping manner by the two optical system sets OP1 and OPS, which correspond to the two adjacent partial regions E1 and E5. When forming such overlapping regions V1 to V6, it is preferred that the exposure view fields of the interference optical systems IO1 to IO7 and the variable shaping optical systems VO1 to VO7 be shaped to be trapezoidal so as to have two parallel sides that extend in the X direction.

When performing exposure with the exposure apparatus of the present example, certain substrate patterns have already been formed on the substrate GP in a previous process. Thus, there are cases in which a new pattern must be exposed while maintaining a predetermined position relationship with the substrate patterns.

Therefore, in the exposure apparatus of the present example, position detection optical systems ALL and ALR are used as shown in FIGS. 1 and 2.

Prior to the above mentioned exposure, the position detection optical systems ALL and ALR detect the positions of the substrate patterns existing on the substrate GP. Based on the detected position information, new patterns may be exposed onto the substrate GP while maintaining the predetermined positional relationship with the existing substrate patterns.

Furthermore, the above mentioned scanning exposure may be performed while detecting the position of the substrate patterns formed on the substrate GP. In this case, the positional information detected by the position detection systems ALL and ARL is transmitted to a position control system (not shown). Based on the position information, the position control system calculates a target control position of the substrate stage PS and transmits a control signal to the linear motor system to control the position of the substrate PS.

Additionally, based on the Y direction positions of the substrate pattern on the substrate GP detected by the position detection optical systems ALL and ALR, the light emission controller LC2 of each of the variable shaping optical systems VO1 to VO7 and the like may be controlled to control the emission of light from the light source LS2. More specifically, exposure with the variable shaping optical systems VO1 to VO7 and the like may be performed when a predetermined relationship is established between the variable shaping optical systems VO1 to VO7 and a predetermined pattern of the substrate patterns, while stopping the exposure with the variable shaping optical systems VO1 to VO7 and the like in other cases.

In the exposure apparatus of the example described above, the interference optical system IO1 and the variable shaping optical system VO1 (or the variable shaping optical systems VO1A and VO1B) are arranged at different positions in the Y direction, that is, at a position having substantially the same X coordinate but a different Y coordinate. However, the arrangement of the optical systems is not limited to such a manner. More specifically, the interference optical systems IO1 to IO7 and the corresponding variable shaping optical systems VO1 to VO7 and the like may be arranged at different X coordinate positions. It is only required that the optical systems be arranged so that exposure is enabled on substantially the entire surface of the substrate GP with one of the interference optical systems IO1 to IO7 and one of the variable shaping optical systems VO1 to VO7 and the like.

Figure 9:
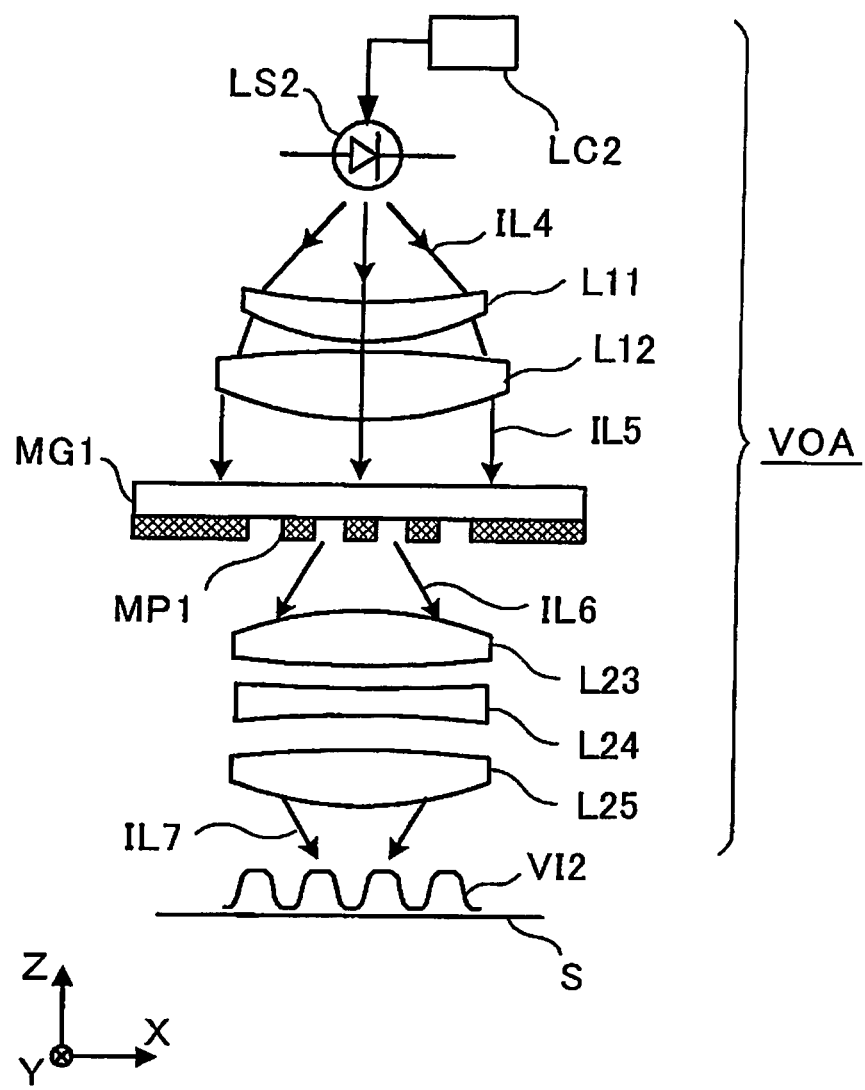
FIG. 9 is a diagram showing a modification of the variable shaping optical system.

The variable shaping optical systems are not limited to the structure shown in FIG. 4 and may have other structures. For example, an optical system VOA shown in FIG. 9 may be used as the variable shaping optical system.

The difference between the variable shaping optical system VO1 shown in FIG. 4 and the variable shaping optical system VOA of the present example is in that the mask pattern of the mask MG1 is projected and imaged on the surface S as a pattern VI2 by imaging optical systems L23, L24, and L25. More specifically, exposure light IL6 transmitted through the mask MG1 enters the image optical systems L23, L24, and L25. This converges the exposure light IL6 into exposure light IL7 and forms the pattern VI2 on the surface S. The remaining structure is the same as the variable shaping optical system VO1 shown in FIG. 4.

Figure 10:
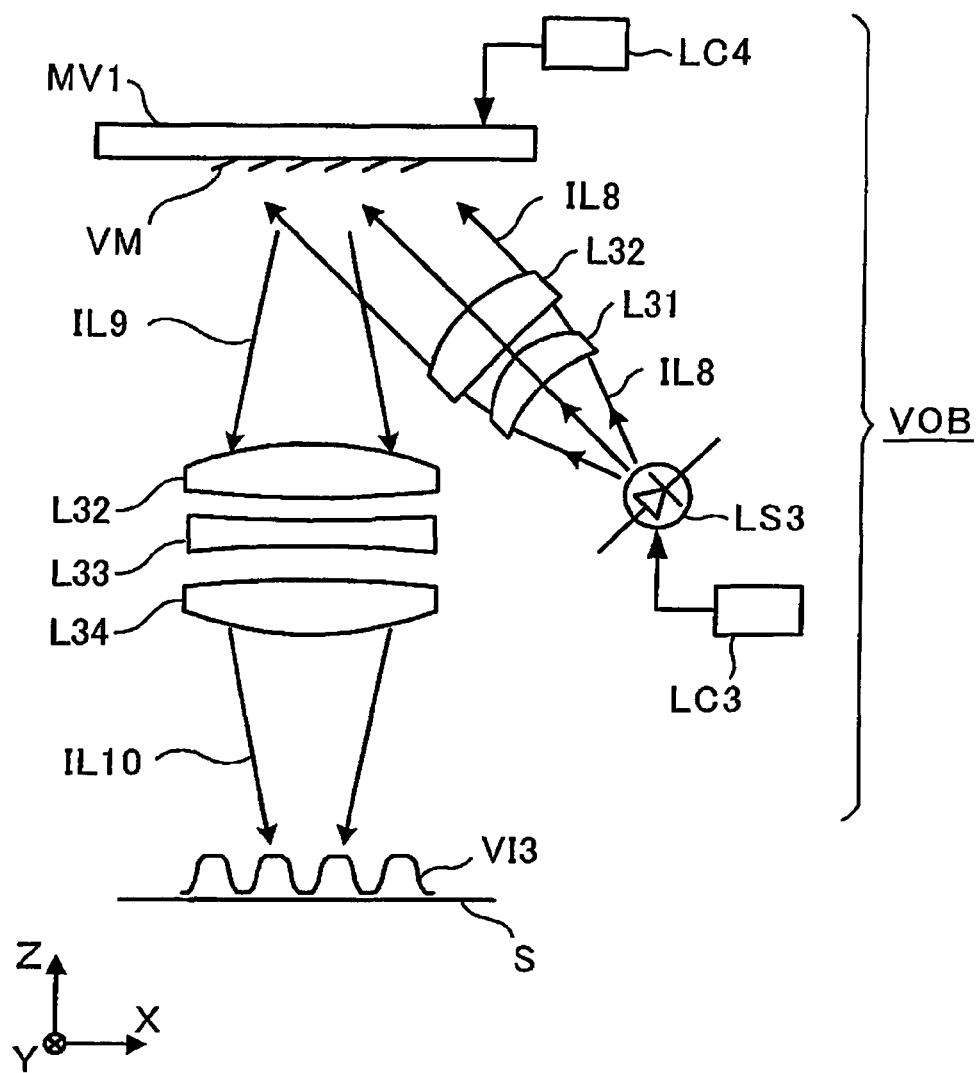
FIG. 10 is a diagram showing another modification of the variable shaping optical system.

For example, an optical system VOB shown in FIG. 10 may also be used as the variable shaping optical system.

The variable shaping optical system VOB shown in FIG. 10 uses a variable shaping mask MV1, which includes a micromirror array VM, as a mask. Exposure light IL8 is emitted from a light source LS3, which is formed by a laser, such as a semiconductor laser, a light emitting diode, or the like. A light emission controller LC3 controls the light source LS3 to start and stop the emission of the exposure light IL8. The exposure light IL8 is shaped by condenser lens L31 and L32 into exposure light IL8 that irradiates the variable shaping mask MV1.

In accordance with the inclination angle of each mirror forming the micro-mirror array VM of the variable shaping mask MV1, the micro-mirror array VM reflects the exposure light IL8 toward projection lenses L32, L33, and L34 or in other directions. Accordingly, a dark-bright pattern V13 is formed on the surface S in accordance with the inclination angle of each mirror of the micro-mirror array VM. The inclination angle of each mirror forming the micro-mirror array VM is variable in accordance with a signal input from a pattern control system LC4.

Accordingly, the variable shaping optical system VOB of the present example has an advantage in that the shape of the exposure pattern exposed onto the substrate GP may be varied with a higher degree of freedom.

The above-described variable shaping optical system that uses a mask other than the variable shaping mask includes a switching mechanism for the light emission controller LC2 and the light source LS2 or the like to perform switching between states in which the substrate GP is irradiated with exposure light and the substrate is not irradiated with exposure light in a timesharing and simultaneous manner. Thus, the input signal that is required to vary the shape of the exposure pattern exposed onto the substrate GP may just be a signal that instructs the light source LS2 and the like or the light emission controller LC2 to start or stop light emission. This is advantageous in that high speed signal transmission is enabled and in that application to scanning exposure at higher speeds is facilitated.

An example of a method for manufacturing a flat panel display substrate using the exposure apparatus and exposure method of the present example will now be discussed with reference to FIGS. 11 and FIG. 12.

Figure 11:
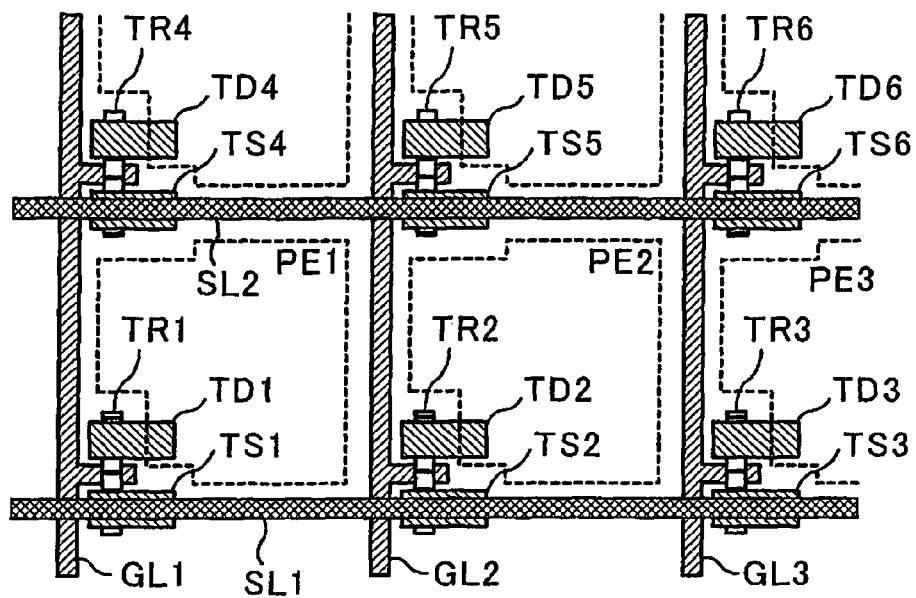
FIG. 11 is a diagram showing part of a liquid crystal display substrate.

FIG. 11 is an enlarged diagram of a so-called display pixel portion formed on a glass substrate of a liquid crystal display, which is one type of a flat panel display.

Among the plurality of display pixels shown in FIG. 11, a display pixel that includes a transparent electrode PE2 and a transistor, which is formed by an active area TR2, a source electrode TS2, and a drain electrode TD2, will now be described. The display pixel is connected to a signal like SL1, which transmits a display signal, and a selection line GL2, which selects this display pixel.

The manufacturing of a display pixel portion according to the present example includes the steps described below.

Figure 12A:
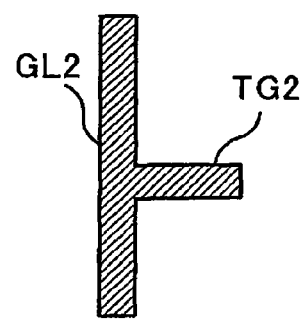
FIG. 12 is a diagram showing an example of a method for manufacturing a flat panel display substrate according to the present invention.

First, in step 1, the selection lime GL1 and the gate electrode TG2 are formed on a glass substrate as shown on FIG. 12(A).

As shown in FIG. 11, the selection line GL2 is part of a plurality of substrate patterns GL1, GL2, and GL3, which are linear patterns extending in one direction and which are arranged at a relatively large period in a direction orthogonal to the linear patterns. Thus, the selection line GL2 may be formed by performing exposure using the first example of the exposure method illustrated in FIG. 5.

More specifically, a metal thin film of aluminum, tantalum, or the like that becomes the material for the selection line GL is formed on the glass substrate. Then, a positive tone photoresist is applied to the metal thin film and the exposure of the above-described first example is performed. The photoresist is developed, and the metal thin film is etched using the obtained resist pattern as an etching mask to form the selection lines GL1, GL2, and GL3.

As shown in FIG. 11, the gate electrode TG2 is a linear pattern having a predetermined length and extending in a direction orthogonal to the selection line GL. Further, the gate electrode TG2 is part of patterns arranged periodically in a two-dimensional manner in accordance with the arrangement period of the display pixels. Thus, the gate electrode TG2 may be formed by performing exposure using the second example of the exposure method illustrated in FIG. 7.

More specifically, a metal thin film of aluminum, tantalum, or the like that becomes the material for the gate electrode TG2 is formed on the glass substrate on which the selection line GL has been formed. Then, a positive tone photoresist is applied to the metal thin film and the exposure of the above-described second example is performed. During the exposure, the glass substrate must be mounted on the exposure apparatus of the present example in a state rotated by 90 degrees from the state in which exposure of the selection line GL is performed. This is because the longitudinal direction of the substrate pattern differs by about 90 degrees between the selection line GL and the gate electrode TG2.

Then, the photoresist is developed, and the metal thin film is etched using the obtained resist pattern as an etching mask to form the gate electrode TG2.

Subsequently, anodic oxidation is performed, for example, in a solution to form a gate oxidation mask on the gate electrode TG2.

Figure 12B:
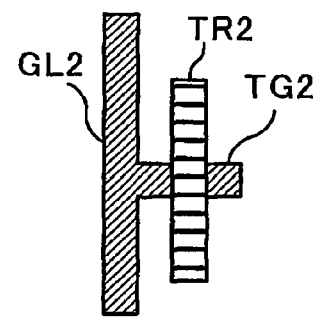

Next, in step 2, a substrate pattern including the active area TR2, which forms a thin film transistor, is formed so as to intersect the gate electrode TG2 as shown in FIG. 12(B).

The active area TR2 is a linear pattern having a predetermined length and extending in a direction orthogonal to the selection line GL. Further, the active area TR2 is part of a plurality of substrate patterns TR1, TR2, TR3, TR4, TR5, and TR6, which are arranged periodically in a two-dimensional manner in accordance with the arrangement period of the display pixels. Thus, the active area TR2 may be formed by performing exposure using the second example of the exposure method illustrated in FIG. 7.

More specifically, a semiconductor thin film of amorphous silicon, polysilicon, or the like that becomes the material for the active area TR2 is formed on the glass substrate. Then, a positive tone photoresist is applied to the semiconductor thin film and the exposure of the above-described second example is performed. The photoresist is developed, and the semiconductor thin film is etched using the obtained resist pattern as an etching mask to form the active area TR2.

Figure 12C:
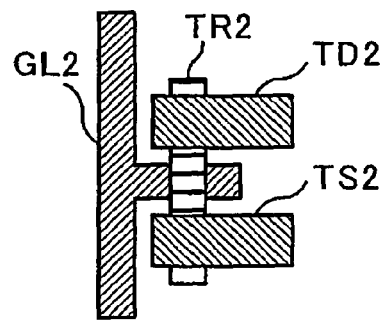

Next, in step 3, the source electrode TS2 and the drain electrode TD2, which are thin film electrodes, are formed at two opposite ends of the active area TR2, as shown in FIG. 12(C).

The source electrode TS2 and the drain electrode TD2 are two adjacent linear patterns having a predetermined length and extending in a direction parallel to the gate electrode TG2. The pair of the two linear patterns is part of substrate patterns TS1, TD1, TS2, TD2, TS3, TD3, TS4, TD4, TS5, TD5, TS6, and TD6, which are arranged periodically in a two-dimensional manner in accordance with the arrangement period of the display pixels.

Figure 8:
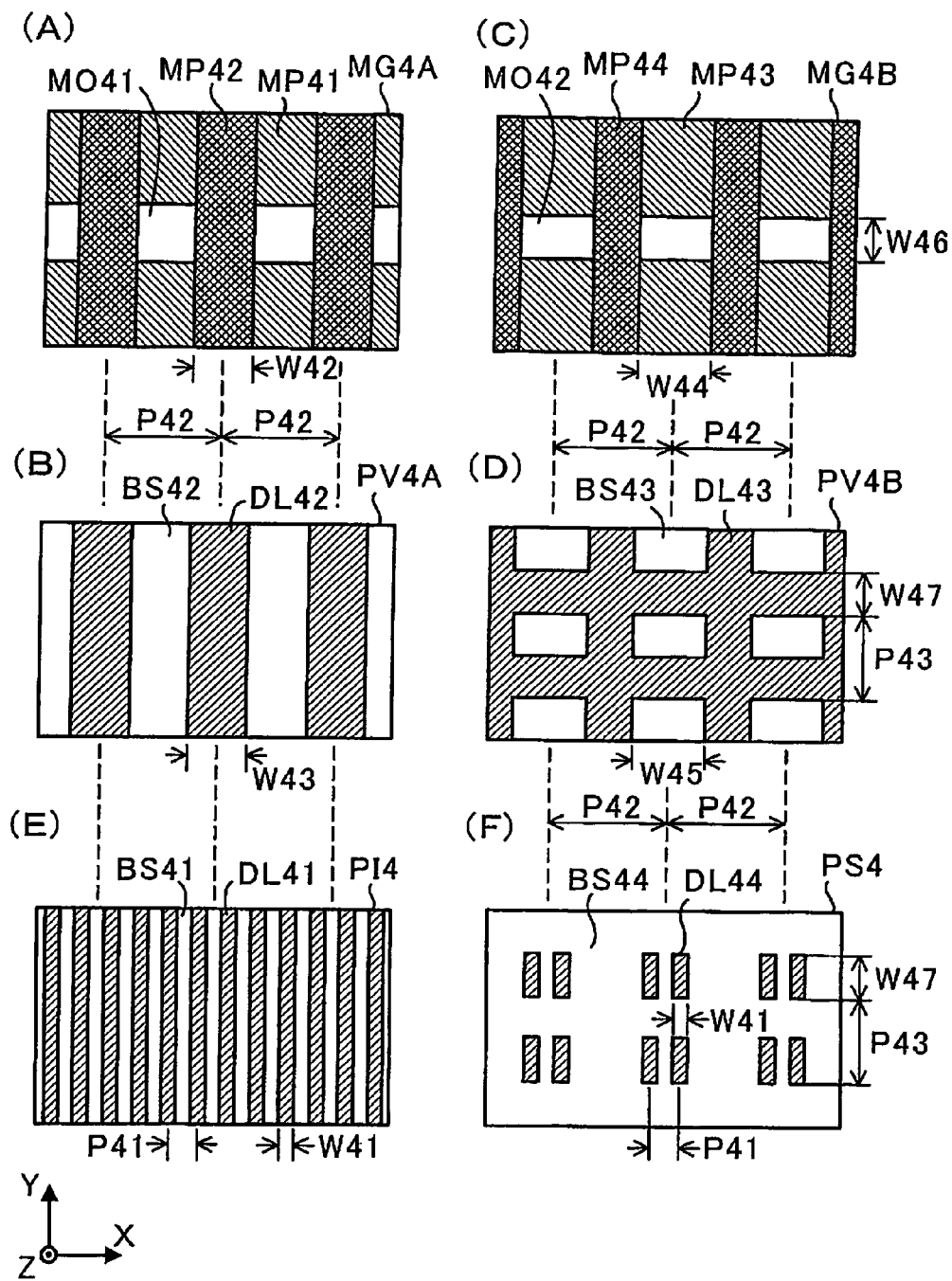
FIG. 8 is a diagram showing a third example of an exposure method according to the present invention.

Accordingly, the source electrode TS2 and the drain electrode TD2 may be formed by performing exposure using the third example of the exposure method illustrated in FIG. 8.

More specifically, a metal thin film of aluminum or the like or a semiconductor thin film of amorphous silicon or the like that becomes the material for the source electrode TS2 and the drain electrode TD2 is formed on the glass substrate. Then, a positive tone photoresist is applied to the thin film and the exposure of the above-described third example is performed. The photoresist is developed, and the thin film is etched using the obtained resist pattern as an etching mask to form the source electrode TS2 and the drain electrode TD2.

During the exposure, the glass substrate must be mounted on the exposure apparatus of the present example in a state rotated by 90 degrees from the state in which exposure of the selection line GL is performed. This is because the longitudinal direction of the substrate pattern differs by 90 degrees between the selection line GL and the source electrode TS2 and drain electrode TD2.

Figure 12D:
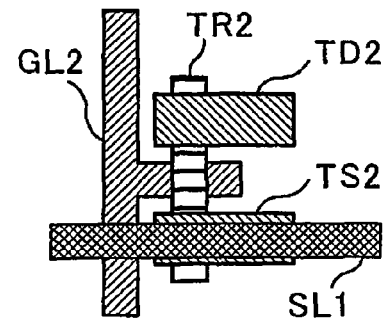

Next, in step 4, the signal line SL1 is formed in alignment with the source electrode as shown in FIG. 12(D).

The signal line SL1 is a linear pattern extending in a direction orthogonal to the selection line GL and is part of substrate patterns SL1 and SL2, which are arranged periodically in a one-dimensional manner in accordance with the arrangement period of the display pixels.

Accordingly, the signal line SL1 may be formed by performing exposure using the first example of the exposure method illustrated in FIG. 5.

More specifically, a metal thin film of aluminum or the like or a semiconductor thin film of amorphous silicon or the like that becomes the material for the signal line SL1 is formed on the glass substrate. Then, a positive tone photoresist is applied to the thin film and the exposure of the above-described first example is performed. The photoresist is developed, and the thin film is etched using the obtained resist pattern as an etching mask to form the signal line SL1.

During the exposure, the glass substrate must be mounted on the exposure apparatus of the present example in a state rotated by 90 degrees from the state in which exposure of the selection line GL is performed. This is because the longitudinal direction of the substrate pattern differs by 90 degrees between the selection line GL and the signal line SL1.

Next, in step 5, transparent electrodes PE1, PE2, and PE3 are partially formed in alignment with the drain electrode. However, the transparent electrodes PE1 to PE3 have widths that are not as fine as those of other elements such as the source electrode and drain electrode. Thus, the transparent electrodes PE1 to PE3 does not have to be formed by performing exposure with the examples according to the exposure method of the present invention and may be formed through methods that perform proximity exposure or projection exposure as in the prior art.

This completes the manufacturing of the display pixel portion on the substrate used for a liquid crystal display.

When performing exposure in accordance with the above first to fifth steps, it is obvious that when the substrate patterns that are to be formed are not that fine, the exposure method of the present example does not have to be performed and, for example, methods that perform proximity exposure or projection exposure as in the prior art may be performed.

In the above description of the method for manufacturing the display pixel portion, known techniques employed in the manufacturing process are not described. However, it is obvious that the above examples may be combined with various types of known techniques to manufacture the flat panel substrate.

The method for manufacturing a substrate for a flat panel display according to the present invention is not limited to the above examples, and the exposure method according to present invention may be used to form any exposure pattern in at least one of the steps of the substrate manufacturing process.

The exposure method according to the present invention is applicable when manufacturing a semiconductor integrated circuit, a flat panel display, a thin film magnetic head, or an electronic device such as a micro-machine and is industrially applicable.

The exposure apparatus according to the present invention is applicable when manufacturing a semiconductor integrated circuit, a flat panel display, a thin film magnetic head, or an electronic device such as a micro-machine and is industrially applicable.

Further, the method for manufacturing a flat panel display substrate is applicable when manufacturing a flat panel display substrate and is industrially applicable.

What is claimed is:

1. An exposure method for exposing a pattern onto a substrate, the exposure method comprising:
   performing relative scanning of the substrate with an interference optical system and a variable shaping optical system in a predetermined scanning direction;
   while performing the relative scanning of the substrate with the interference optical system in the predetermined scanning direction, performing interference exposure so as to expose a pattern onto the substrate with the interference optical system;

while performing the relative scanning of the substrate with the variable shaping optical system in the predetermined scanning direction, performing variable shaping exposure on the substrate using the variable shaping optical system; and setting an interval between the interference optical system and the variable optical system to be less than or equal to the length of the substrate in the predetermined scanning direction before relative scanning of the substrate with the interference optical system and the variable optical system.

2. The exposure method according to claim 1, wherein the interference optical system includes a grating.

3. The exposure method according to claim 2, wherein the grating is one of two gratings arranged along a travel direction of exposure light.

4. The exposure method according to claim 3, wherein:
the two gratings include a first grating arranged at an upstream side of the exposure light and a second grating arranged between the first grating and the substrate, with the first grating and the second grating being spaced by a first distance, and the second grating and the substrate being spaced by a second distance that is substantially equal to the first distance; and
the first grating has a period that is two times as large as that of the second grating.

5. The exposure method according to claim 1, wherein the interference optical system is configured to perform time-sharing switching between states in which the substrate is irradiated with exposure light and the substrate is not irradiated with exposure light.

6. The exposure method according to claim 1, wherein the variable shaping optical system is configured so as to irradiate the substrate with exposure light through a plurality of beam spots.

7. The exposure method according to claim 6, wherein the variable shaping optical system includes a mask for forming the plurality of beam spots.

8. The exposure method according to claim 7, wherein the mask is a variable shaping mask.

9. The exposure method according to claim 1, wherein the variable shaping optical system is configured to perform timesharing switching between states in which the substrate is irradiated with exposure light and the substrate is not irradiated with exposure light.

10. The exposure method according to claim 1, wherein the variable shaping optical system is one of a plurality of the variable shaping optical systems, and the interference optical system and the variable shaping optical systems are arranged along the scanning direction.

11. The exposure method according to claim 1, wherein the interference optical system is one of a plurality of interference optical systems arranged at different positions of a coordinate system that is orthogonal to the scanning direction.

12. The exposure method according to claim 1, wherein the variable shaping optical system is one of a plurality of variable shaping optical systems arranged at different positions of a coordinate system that is orthogonal to the scanning direction.

13. The exposure method according to claim 1, further comprising:
detecting positional information of a substrate pattern on the substrate during the relative scanning; and
controlling positional relationship of the optical system and the substrate based on the positional information.

14. The exposure method according to claim 1, wherein the interference exposure forms on the substrate an exposure pattern including a plurality of dark line portions and a plurality of bright line portions, and the variable shaping exposure leaves certain dark line portions arranged at every predetermined number of dark line portions in the exposure pattern and changes other dark line portions to bright portions.

15. The exposure method according to claim 1, wherein the interference exposure forms on the substrate an exposure pattern including a plurality of dark line portions and a plurality of bright line portions, and the variable shaping exposure leaves part of each of certain dark line portions arranged at every predetermined number of dark line portions in the exposure pattern as dark portions, with the part of each certain dark line portion being arranged at a predetermined position in the scanning direction.

16. The exposure method according to claim 1, wherein the interference exposure forms on the substrate an exposure pattern including a plurality of dark line portions and a plurality of bright line portions, and the variable shaping exposure leaves part of each of at least two dark line portions arranged adjacently in the exposure pattern as dark portions, with the part of the at least two dark line portions being arranged at predetermined positions in the scanning direction.

17. The exposure method according to claim 1, wherein the interval is less than or equal to the length of a substrate stage, which holds the substrate, in the scanning direction.

18. The exposure method according to claim 1, wherein the interval is less than or equal to one fourth the length of the substrate in the scanning direction.

19. A method for manufacturing a flat panel display substrate, the method comprising:
an exposure step including at least one step of exposing a pattern onto a substrate according to an exposure method, the exposure method comprising:
performing relative scanning of the substrate with an interference optical system and a variable shaping optical system in a predetermined scanning direction;
while performing the relative scanning of the substrate with the interference optical system in the predetermined scanning direction, performing interference exposure so as to expose a pattern onto the substrate with the interference optical system;
while performing the relative scanning of the substrate with the variable shaping optical system in the predetermined scanning direction, performing variable shaping exposure on the substrate using the variable shaping optical system; and
setting an interval between the interference optical system and the variable optical system to be less than or equal to the length of the substrate in the predetermined scanning direction before relative scanning of the substrate with the interference optical system and the variable optical system in the scanning direction.

20. A method for manufacturing a flat panel display substrate, the method comprising:
forming a pattern for forming a source electrode and drain electrode of a thin film transistor according to an exposure method, the exposure method comprising:
performing relative scanning of the substrate with an interference optical system and a variable shaping optical system in a predetermined scanning direction;
while performing the relative scanning of the substrate with the interference optical system in the predetermined scanning direction, performing interference exposure so as to expose a pattern onto the substrate with the interference optical system;

while performing the relative scanning of the substrate with the variable shaping optical system in the predetermined scanning direction, performing variable shaping exposure on the substrate using the variable shaping optical system; and setting an interval between the interference optical system and the variable optical system to be less than or equal to the length of the substrate in the predetermined scanning direction before relative scanning of the substrate with the interference optical system and the variable optical system in the scanning direction, wherein the interference exposure forms on the substrate an exposure pattern including a plurality of dark line portions and a plurality of bright line portions, and the variable shaping exposure leaves part of each of at least two dark line portions arranged adjacently in the exposure pattern as dark portions, with the part of the at least two dark line portions being arranged at predetermined positions in the scanning direction; and forming the source electrode and drain electrode of the thin film transistor with the use of the formed pattern.

\* \* \* \* \*

UNITED STATES PATENT AND TRADEMARK OFFICE
CERTIFICATE OF CORRECTION

| | | |
|---|---|---|
| PATENT NO. | : 8,431,328 B2 | Page 1 of 1 |
| APPLICATION NO. | : 12/010153 | |
| DATED | : April 30, 2013 | |
| INVENTOR(S) | : Shiraishi et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 307 days.

Signed and Sealed this
Thirtieth Day of December, 2014

Michelle K. Lee
*Deputy Director of the United States Patent and Trademark Office*